United States Patent
Taki et al.

(10) Patent No.: US 12,246,986 B2
(45) Date of Patent: Mar. 11, 2025

(54) LAMINATED BODY AND METHOD OF MANUFACTURING LAMINATED BODY

(71) Applicant: AGC Inc., Tokyo (JP)

(72) Inventors: Shunya Taki, Tokyo (JP); Naoko Okada, Tokyo (JP); Yasuyuki Takimoto, Tokyo (JP); Haruhiko Yoshino, Tokyo (JP)

(73) Assignee: AGC INC., Tokyo (JP)

( * ) Notice: Subject to any disclaimer, the term of this patent is extended or adjusted under 35 U.S.C. 154(b) by 106 days.

(21) Appl. No.: 17/580,205

(22) Filed: Jan. 20, 2022

(65) Prior Publication Data

US 2022/0145697 A1  May 12, 2022

Related U.S. Application Data

(63) Continuation of application No. PCT/JP2020/026729, filed on Jul. 8, 2020.

(30) Foreign Application Priority Data

Jul. 25, 2019  (JP) .................. 2019-137115

(51) Int. Cl.
*C03C 17/36* (2006.01)
*B32B 17/10* (2006.01)
(Continued)

(52) U.S. Cl.
CPC .... *C03C 17/3644* (2013.01); *B32B 17/10036* (2013.01); *C03C 17/3626* (2013.01);
(Continued)

(58) Field of Classification Search
CPC ........ G02B 5/281; G02B 5/282; G02B 5/285; C03C 17/366; C03C 17/3644;
(Continued)

(56) References Cited

U.S. PATENT DOCUMENTS 5,344,718 A    9/1994 Hartig et al.
5,514,476 A *  5/1996 Hartig .................. C03C 17/366
                                                    359/360
(Continued)

FOREIGN PATENT DOCUMENTS

CN    110467360 A  * 11/2019
EP    0488048 A1  *  6/1992
(Continued)

OTHER PUBLICATIONS

Dariani et al, "Characterization of nanocrystalline Ti films deposited by DC magnetron sputtering onto FTO glass substrate", J. Mater. Res., vol. 30, No. 20, Oct. 28, 2015.*
(Continued)

*Primary Examiner* — Z. Jim Yang
(74) *Attorney, Agent, or Firm* — Foley & Lardner LLP (57) ABSTRACT

A laminated body includes a transparent substrate having a laminated film. The laminated film includes a dielectric layer containing silicon nitride, a barrier layer composed of a single film or two or more films, and a metal layer containing silver. The barrier layer has a thickness of from 0.1 nm to 10 nm. Each film of the barrier layer includes a material having a crystal structure of a face-centered cubic structure with a lattice constant of from 3.5 to 4.2, a hexagonal close-packed structure with a lattice constant of from 2.6 to 3.3, a body-centered cubic structure with a lattice constant of from 2.9 to 3.2, or a tetragonal crystal with a lattice constant of from 2.9 to 4.4. The metal layer has a thickness of from 7 nm to 25 nm. An orientation index P of the metal layer falls within a range from 4.5 to 20.

14 Claims, 4 Drawing Sheets

(51) Int. Cl.
*E06B 3/67* (2006.01)
*E06B 9/24* (2006.01)

(52) U.S. Cl.
CPC ........ *C03C 17/3649* (2013.01); *C03C 17/366* (2013.01); *C03C 17/3681* (2013.01); *E06B 3/6715* (2013.01); *E06B 9/24* (2013.01); *C03C 2217/216* (2013.01); *C03C 2217/256* (2013.01); *C03C 2217/261* (2013.01); *C03C 2217/281* (2013.01); *C03C 2218/154* (2013.01); *E06B 2009/2417* (2013.01)

(58) Field of Classification Search
CPC ............ C03C 17/3647; C03C 17/3681; C03C 2217/254–256
See application file for complete search history.

(56) References Cited

U.S. PATENT DOCUMENTS

| | | | | |
|---|---|---|---|---|
| 5,800,933 | A * | 9/1998 | Hartig | C03C 17/36 428/673 |
| 5,821,001 | A * | 10/1998 | Arbab | C03C 17/3618 428/630 |
| 6,475,626 | B1 | 11/2002 | Stachowiak | |
| 6,586,102 | B1 * | 7/2003 | Stachowiak | C03C 17/36 428/428 |
| 6,589,658 | B1 * | 7/2003 | Stachowiak | C03C 17/36 428/704 |
| 8,147,969 | B2 | 4/2012 | LaBrousse et al. | |
| 2002/0009601 | A1 * | 1/2002 | Stachowiak | C03C 17/366 204/192.1 |
| 2002/0142149 | A1 * | 10/2002 | Nakashima | C03C 17/3607 428/323 |
| 2003/0198808 | A1 * | 10/2003 | Muromachi | C03C 17/3681 204/192.15 |
| 2007/0278490 | A1 * | 12/2007 | Hirao | H01L 29/7869 257/64 |
| 2010/0071810 | A1 * | 3/2010 | Nadaud | C03C 17/2456 148/516 |
| 2010/0209729 | A1 | 8/2010 | Thomsen et al. | |
| 2013/0082787 | A1 * | 4/2013 | Zhang | C23C 14/165 204/192.15 |
| 2014/0048013 | A1 | 2/2014 | Ding et al. | |
| 2014/0186598 | A1 * | 7/2014 | Ding | C03C 17/3644 427/164 |
| 2014/0268317 | A1 * | 9/2014 | Ding | G02B 5/208 359/359 |
| 2014/0272335 | A1 * | 9/2014 | Hassan | C03C 17/3644 117/106 |
| 2015/0183301 | A1 * | 7/2015 | Diguet | G02B 5/282 204/192.15 |
| 2015/0191815 | A1 * | 7/2015 | Ding | C23C 14/185 427/164 |
| 2015/0345005 | A1 * | 12/2015 | Ding | C03C 17/3681 428/332 |
| 2016/0306084 | A1 * | 10/2016 | Padiyath | G02B 1/11 |
| 2017/0023557 | A1 * | 1/2017 | Dicks | A61B 5/14735 |
| 2017/0190611 | A1 * | 7/2017 | Brossard | C23C 14/185 |
| 2018/0251888 | A1 * | 9/2018 | Boyce | C03C 17/36 |
| 2018/0282206 | A1 | 10/2018 | Guimard et al. | |
| 2019/0322576 | A1 * | 10/2019 | Guimard | C23C 14/0036 |
| 2020/0255330 | A1 * | 8/2020 | Xu | C03C 17/3626 |
| 2020/0274051 | A1 * | 8/2020 | Kimura | C23C 14/06 |
| 2020/0309997 | A1 * | 10/2020 | Ma | B32B 17/10036 |
| 2021/0395138 | A1 * | 12/2021 | Jacquet | C03C 17/3652 |
| 2022/0041496 | A1 * | 2/2022 | Turkuz | C03C 17/36 |

FOREIGN PATENT DOCUMENTS

| | | | | |
|---|---|---|---|---|
| EP | 0548971 | A1 * | 6/1993 | |
| EP | 3862459 | A1 * | 8/2021 | ............ C03C 17/36 |
| IN | 201717016353 | | 10/2017 | |
| JP | H06-171984 | A | 6/1994 | |
| WO | WO-2015014854 | A2 * | 2/2015 | ........ C03C 17/3618 |
| WO | WO-2016/060082 | A1 | 4/2016 | |
| WO | WO-2016171779 | A1 * | 10/2016 | ............ B32B 15/04 |

OTHER PUBLICATIONS

Rao et al, "Microstructural and mechanical characteristics of Ni—Cr thin films", Materials Research Bulletin, vol. 66, 2015, 59-64.*

Machine translation of CN 110467360 A.*

International Searching Authority, "International Search Report," issued in connection with International Patent Application No. PCT/JP2020/026729, dated Sep. 24, 2020.

International Searching Authority, "Written Opinion," issued in connection with International Patent Application No. PCT/JP2020/026729, dated Sep. 24, 2020.

* cited by examiner

LAMINATED BODY AND METHOD OF MANUFACTURING LAMINATED BODY

CROSS-REFERENCE TO RELATED APPLICATION

The present application is a continuation application of International Application No. PCT/JP2020/026729, filed Jul. 8, 2020, which claims priority to Japanese Patent Application No. 2019-137115 filed Jul. 25, 2019. The contents of these applications are incorporated herein by reference in their entirety.

BACKGROUND OF THE INVENTION

1. Field of the Invention

The present disclosure relates to a laminated body and a method of manufacturing a laminated body.

2. Description of the Related Art

According to recent heightened awareness of energy saving, heat shielding glass has been increasingly applied to window panes of buildings, and the like.

Heat shielding glass is also referred to as heat-ray reflection glass, and is configured by providing, for example, a laminated film containing a silver layer on a surface of a glass substrate (See, for example, WO 2016/060082).

When such heat shielding glass is applied to a window pane, heat rays entering the heat shielding glass from outside a room are reflected by the laminated film. Thus, heat rays are prevented from entering the room and a heat shielding property can be enhanced.

SUMMARY OF INVENTION

Problem to be Solved by the Invention

Recently, for example, in window panes of buildings, heat shielding glass having a low sheet resistance value, an excellent heat shielding property, and high transparency to visible light (hereinafter simply referred to as "transparency") has been required.

However, in heat shielding glass, a heat shielding property and transparency are often in a trade-off relation with each other, and it may be difficult to achieve both the heat shielding property and the transparency.

For example, the heat shielding property of the heat shielding glass can be enhanced to some extent by increasing a thickness of the silver layer included in the laminated film. However, the heat shielding glass with the thick silver layer has a problem that the transparency of the silver layer and the transparency of the entire heat shielding glass are reduced.

The present invention has been made in view of the above-described problem, and aims at providing a laminated body having a low sheet resistance value, an excellent heat shielding property, and high transparency, and a method of manufacturing the same.

Means for Solving Problems

According to an aspect of the present invention, a laminated body including
a transparent substrate having a first surface; and
a laminated film provided on the first surface of the transparent substrate,
the laminated film including,
in the order close to the first surface,
a dielectric layer containing silicon nitride,
a barrier layer composed of a single film or two or more films arranged on the dielectric layer, and
a metal layer containing silver arranged on the barrier layer,
the barrier layer having a thickness of from 0.1 nm to 10 nm,
each film of the barrier layer including a material "A" that has a crystal structure of a face-centered cubic (fcc) structure with a lattice constant of from 3.5 to 4.2, a hexagonal close-packed (hcp) structure with a lattice constant of from 2.6 to 3.3, a body-centered cubic (bcc) structure with a lattice constant of from 2.9 to 3.2, or a tetragonal crystal with a lattice constant of from 2.9 to 4.4,
the metal layer containing silver having a thickness of from 7 nm to 25 nm,
an orientation index of the metal layer containing silver, expressed by formula (1)

[Math 1]

$$P = \frac{\mathrm{Max}I[Is(111), Is(200), Is(220), Is(311)]}{\mathrm{Max}II[Is(111), Is(200), Is(220), Is(311)]}, \quad (1)$$

falling within a range from 4.5 to 20,
where Max I[a, b, c, d] represents the greatest value from among elements a, b, c, and d, and Max II[a, b, c, d] represents the second greatest value from among elements a, b, c, and d, is provided.

Moreover, according to another aspect of the present invention, a method of manufacturing a laminated body including
a step of forming a dielectric layer containing silicon nitride on a transparent substrate having a first surface, by a sputtering method at a predetermined electric power density in a discharge gas containing nitrogen, a content of nitrogen in the discharge gas ranging from 85% by volume to 100% by volume,
the predetermined electric power density ranging from 36 kW/m$^2$ to 70 kW/m$^2$ for a planar target and ranging from 128 kW/m$^2$ to 363 kW/m$^2$ for a cylindrical target,
a step of forming a barrier layer composed of a single film or two or more films on the dielectric layer by the sputtering method,
the barrier layer having a thickness of from 0.1 nm to 10 nm, each film of the barrier layer including a material "A" which has a crystal structure of a face-centered cubic (fcc) structure with a lattice constant of from 3.5 to 4.2 angstrom, a hexagonal close-packed (hcp) structure with a lattice constant of from 2.6 to 3.3 angstrom, a body-centered cubic (bcc) structure with a lattice constant of from 2.9 to 3.2 angstrom, or a tetragonal crystal with a lattice constant of from 2.9 to 4.4 angstrom, and
a step of forming a metal layer containing silver having a thickness of from 7 nm to 25 nm on the barrier layer by the sputtering method, is provided.

Effects of the Invention

According to an embodiment of the present disclosure, a laminated body having a low sheet resistance value, an excellent heat shielding property, and high transparency, and a method of manufacturing the same, can be provided.

BRIEF DESCRIPTION OF DRAWINGS

Other objects and further features of the present disclosure will be apparent from the following detailed description when read in conjunction with the accompanying drawings, in which.

MODE FOR CARRYING OUT THE INVENTION

In the following, an embodiment of the present invention will be described.

In the embodiment of the present invention,
a laminated body including
a transparent substrate having a first surface; and
a laminated film provided on the first surface of the transparent substrate,
the laminated film including,
in the order close to the first surface,
a dielectric layer containing silicon nitride,
a barrier layer composed of a single film or two or more films arranged on the dielectric layer, and
a metal layer containing silver arranged on the barrier layer,
the barrier layer having a thickness of from 0.1 nm to 10 nm,
each film of the barrier layer including a material "A" which has a crystal structure of a face-centered cubic (fcc) structure with a lattice constant of from 3.5 to 4.2 angstrom, a hexagonal close-packed (hcp) structure with a lattice constant of from 2.6 to 3.3 angstrom, a body-centered cubic (bcc) structure with a lattice constant of from 2.9 to 3.2 angstrom, or a tetragonal crystal with a lattice constant of from 2.9 to 4.4 angstrom,
the metal layer containing silver having a thickness of from 7 nm to 25 nm,
an orientation index P of the metal layer containing silver, expressed by formula (1)

[Math 2]

$$P = \frac{\text{Max}I[Is(111), Is(200), Is(220), Is(311)]}{\text{Max}II[Is(111), Is(200), Is(220), Is(311)]}, \quad (1)$$

falling within a range from 4.5 to 20,
where Max I[a, b, c, d] represents the greatest value from among elements a, b, c, and d, and Max II[a, b, c, d] represents the second greatest value from among elements a, b, c, and d,
is provided.

Moreover, values of the elements in formula (1), Is(hkl), are obtained from the following formulas (2) to (5)

[Math 3]

$$Is(111) = I(111)/24 \quad (2)$$

[Math 4]

$$Is(200) = I(200)/46 \quad (3)$$

[Math 5]

$$Is(220) = I(220)/99 \quad (4)$$

[Math 6]

$$Is(311) = I(311)/25 \quad (5)$$

where I(111), I(200), I(220), and I(311) are peak intensities in plane orientations of (111), (200), (220), and (311) obtained by in-plane X-ray diffraction measurements for the metal layer.

Values of denominators on the right-hand sides of formulas (2) to (5) correspond to ratios of peak intensities of four directions of (111), (200), (220), and (311) for a silver powder pattern obtained from the inorganic materials database (AtomWork) of the National Institute for Materials Science associated with the peak intensities in plane orientations obtained by the in-plane X-ray diffraction measurements, i.e. 24:46:99:25.

The orientation index P of the metal layer containing silver represented by the above-described formula (1) can be used as a measure of a sheet resistance value of the layer. In other words, in the metal layer containing silver with a high orientation index P, one crystal orientation is significantly dominant as compared to the other crystal orientation, and thus the crystal orientation is high. The metal layer containing silver with the high crystal orientation tends to have a relatively smaller number of defects and electrons can flow easily, thus the sheet resistance value tends to be small.

However, as described above, it may be difficult to achieve both an excellent heat shielding property and high transparency with the conventional heat shielding glass.

For example, the heat shielding property of the heat shielding glass can be enhanced to some extent by increasing a thickness of the silver layer included in the laminated film. However, the heat shielding glass with the thick silver layer has a problem that the transparency of the silver layer and the transparency of the entire heat shielding glass are reduced.

In contrast, a transparent substrate and a transparent dielectric layer are used in the laminated body according to the embodiment of the present invention. In the present application, "transparent" means that visible light transmittance is 50% or more. The barrier layer is adjusted so that the thickness falls within a range from 0.1 nm to 10 nm, and the metal layer containing silver is adjusted so that a thickness falls within a range from 7 nm to 25 nm.

Accordingly, the laminated body according to the embodiment of the present invention can achieve excellent transparency.

Also, in the laminated body according to the embodiment of the present invention, a thin barrier layer is provided on the dielectric layer, including a material "A" having a predetermined crystal structure. Such thin barrier layers are affected by the surface properties of the underlying dielectric layer and the crystal orientation is improved.

Thus, it is possible to develop a crystal structure with a dominant orientation in a specific direction in the metal containing silver disposed on the barrier layer according to the crystal orientation of the barrier layer. Then, the metal layer containing silver can be configured such that the above-described orientation index P falls within a range from 4.5 to 20. Further, by obtaining the metal layer containing silver having the above-described orientation index P, sheet resistance values of the metal layer containing silver and of the entire laminated body can be significantly reduced.

The inventors of the present application newly found that the crystal orientation of the metal layer can be controlled by the surface properties of the dielectric layer under the barrier layer, regardless of whether the barrier layer under the metal layer is formed of an oxide-based material or a non-oxide-based material.

As described above, in the laminated body according to the embodiment of the present invention, an excellent heat shielding property can be obtained without increasing the thickness of the metal layer containing silver so much. Accordingly, according to the embodiment of the present invention, a laminated body with an excellent heat shielding property and high transparency can be obtained.

In the present application, an index Tv/Rs is introduced to represent the balance between the heat shielding property and the transparency of the laminated film. In the index Tv/Rs, Tv is visible light transmittance (%) of the laminated body and Rs is sheet resistance value ($\Omega$/sq) of the laminated body.

In general, reflection of light by a metal layer results from vibrations of free electrons. As the number of free electrons increases, the reflectivity tends to become higher. Thus, the heat shielding property is enhanced. In addition, as the number of free electrons increases, the sheet resistance value of the metal layer decreases. Therefore, it can be said that the lower the sheet resistance value of the metal layer included in the laminated film, the higher the heat shielding property of the laminated film.

In addition, a parameter called selectivity Se is often used as an indicator of a balance between the heat shielding property and the transparency of the laminated body. The ratio Tv/Rs can be used as an indicator that correlates with the selectivity Se. That is, it can be said that in the laminated body, the higher the transmittance and the lower the sheet resistance value, that is, the larger the ratio Tv/Rs, the higher the transparency of the laminated body and the higher the heat shielding property of the laminated body.

(Laminated Body According to the Embodiment of the Present Invention)

In the following, the laminated body according to the embodiment of the present invention will be described in more detail with reference to FIG. 1.

Figure 1:
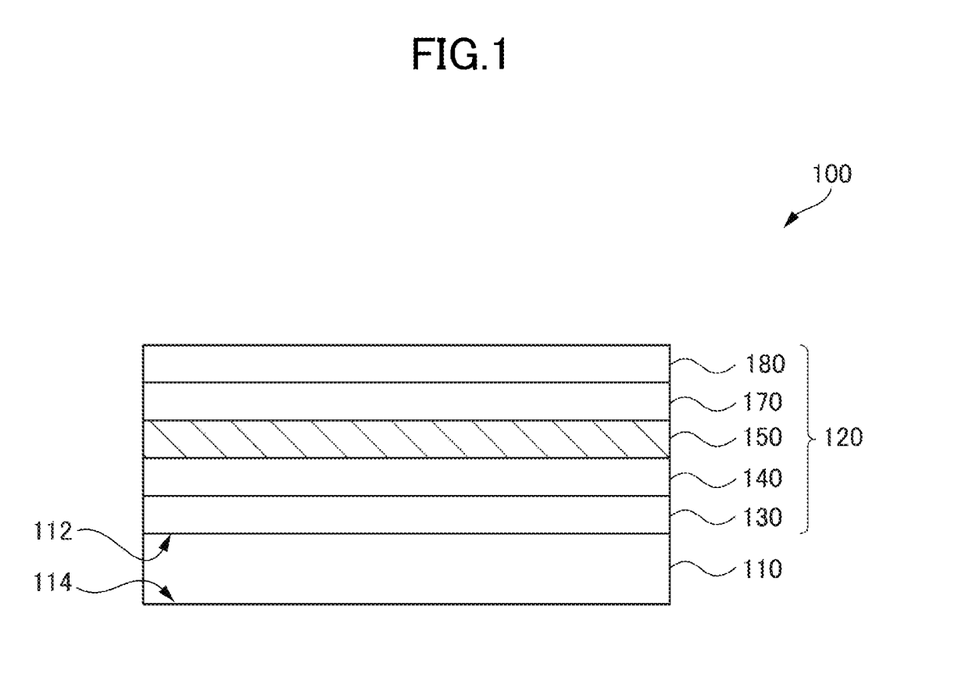
FIG. 1 is a cross-sectional view schematically depicting a laminated body according to an embodiment of the present invention.

FIG. 1 is a diagram schematically illustrating a cross-section of the laminated body (hereinafter referred to as a "first laminated body") according to the embodiment of the present invention.

As shown in FIG. 1, the first laminated body 100 includes a transparent substrate 110 and a laminated film 120.

The transparent substrate 110 has a first surface 112 and a second surface 114, and the laminated film 120 is disposed on the first surface 112 of the transparent substrate 110.

The laminated film 120 has a first dielectric layer 130, a first barrier layer 140, a metal layer containing silver (hereinafter, simply referred to as a "metal layer") 150, a second barrier layer 170, and a second dielectric layer 180.

The first dielectric layer 130 is formed of a dielectric substance containing silicon nitride, and has a role of reducing the visible light reflectivity.

The first barrier layer 140 includes a material "A" and has a role of improving and stabilizing the crystal orientation of the metal layer. The first barrier layer 140 has a thickness ranging from 0.1 nm to 10 nm, and the first barrier layer 140 is transparent.

As shown in FIG. 1, the first barrier layer 140 is preferably disposed right above the first dielectric layer 130.

The metal layer 150 includes silver and has a role of reflecting heat rays incident on the first laminated body 100. The metal layer 150 has a thickness ranging from 7 nm to 25 nm and is transparent.

As shown in FIG. 1, the metal layer 150 is preferably disposed right above the first barrier layer 140.

The second barrier layer 170 and the second dielectric layer 180 have a role of protecting the metal layer 150 from the outside. However, the second barrier layer 170 and the second dielectric layer 180 may not be disposed.

The material "A" contained in the first barrier layer 140 has a crystal structure of any one of a face-centered cubic (fcc) structure with a lattice constant of from 3.5 to 4.2 angstrom, a hexagonal close-packed (hcp) structure with a lattice constant of from 2.6 to 3.3 angstrom, a body-centered cubic (bcc) structure with a lattice constant of from 2.9 to 3.2 angstrom, and a tetragonal crystal with a lattice constant of from 2.9 to 4.4 angstrom.

By forming the metal layer 150 on the above-described first barrier layer 140, the orientation index P of the metal layer 150 expressed by the above-described formula (1) can be relatively easily adjusted to fall within the range from 4.5 to 20.

Moreover, because the orientation index P of the metal layer 150 is adjusted to fall within the range from 4.5 to 20, in the first laminated body 100, the sheet resistance value of the metal layer 150 can be significantly suppressed while suppressing the thickness of the metal layer 150.

According to the above-described effects, a significantly higher ratio Tv/Rs can be obtained for the first laminated body 100.

(Configuration of Each Member Included in the Laminated Body According to the Embodiment of the Present Invention)

Next, the configuration of each member included in the laminated body according to the embodiment of the present invention will be described in more detail. Hereinafter, components of the first laminated body 100, as an example, will be described. Accordingly, the reference numerals shown in FIG. 1 will be used to indicate each member and layer.

(Transparent Substrate 110)

The transparent substrate 110 is made of a transparent material, such as a resin or glass.

(First Dielectric Layer 130)

The first dielectric layer 130 is made of a dielectric substance including silicon nitride. The first dielectric layer 130 may further include Al. For example, the first dielectric layer 130 may be formed of SiAlN.

The first dielectric layer 130 has a thickness ranging from 10 nm to 60 nm. The thickness preferably ranges from 20 nm to 50 nm.

(First Barrier Layer 140)

The first barrier layer 140 has a thickness ranging from 0.1 nm to 10 nm. The thickness preferably ranges from 0.1 nm to 3.5 nm. When the thickness of the first barrier layer 140 is nm or less, it becomes possible to cause the metal layer 150 to be affected by the surface properties of the first dielectric layer 130.

The first barrier layer 140 need not consist of a single film, but may consist of a plurality of films. In the latter case, the thickness of the first barrier layer 140 means the total thickness of all the films.

The material "A" contained in the first barrier layer 140 has the following crystal structure:
  (i) a face-centered cubic (fcc) structure with a lattice constant of from 3.5 to 4.2 angstrom;
  (ii) a hexagonal close-packed (hcp) structure with a lattice constant of from 2.6 to 3.3 angstrom;
  (iii) a body-centered cubic (bcc) structure with a lattice constant of from 2.9 to 3.2 angstrom; or
  (iv) a tetragonal crystal with a lattice constant of from 2.9 to 4.4 angstrom.

Suitable materials for the crystal structure (i), among the above-described crystal structures, include, for example, metal Ni (a=3.52 Å), $NiCr_x$ (x ranges from 0.1 to 0.5, a=3.52 Å), $NiFe_x$ (x ranges from 0.1 to 0.5, a=3.52 Å), metal Al (a=4.05 Å), CrN (a=4.14), TiN (a=4.24 Å), MgO (a=4.22 Å), TiO (a=4.18 Å), and $NiCr_xO$ (x ranges from 0.1 to 0.5, a=4.18 Å).

Suitable materials for the crystal structure (ii) include, for example,
metal Ni (a=2.62 Å), $NiCr_x$ (x ranges from 0.1 to 0.5, a=2.62 Å), $NiFe_x$ (x ranges from 0.1 to 0.5, a=2.62 Å), Ti (a=2.95 Å), Mg (a=3.21 Å), AlN (a=3.11 Å), and ZnO (a=3.25 Å).

Suitable materials for the crystal structure (iii) include, for example, Cr (a=2.88 Å), and Nb (a=3.31 Å).

Suitable materials for the crystal structure (iv) include, for example, $CrO_2$ (a=4.42 Å).

In the above descriptions, the symbol "a" after the name of the material represents a length of the crystal in the a-axis direction.

As the material contained in the first barrier layer 140, in particular, AlN, ZnO, Ni, Cr, and $NiCr_x$ (x ranges from 0.1 to 0.5) are preferably used, because the above-described materials are easily affected by the surface properties of the underlying first dielectric layer 130 and the crystal orientation can be easily improved.

It should be noted that the material "A" included in the first barrier layer 140 may be doped with added elements.
(Metal Layer 150)

The metal layer 150 includes a layer containing silver. The metal layer may include, for example, a silver alloy. Suitable silver alloys include, for example, a Ag—Au alloy, a Ag—Pd alloy, and a Ag—Ni alloy. An amount of silver contained in the silver alloy is preferably 90 wt % or more.

The metal layer 150 has a thickness ranging from 7 nm to 25 nm. When the thickness of the metal layer 150 exceeds 25 nm, the transparency of the metal layer 150 decreases.

The metal layer 150 has the orientation index P ranging from 4.5 to 20, as described above. The orientation index P preferably falls within the range from 7 to 15. When the orientation index P is less than 4.5, the preferred crystal orientation of the metal layer 150 may decrease and the sheet resistance value may increase. In such a case, the heat shielding property is reduced and the ratio Tv/Rs is also reduced.
(Second Barrier Layer 170)

The second barrier layer 170 may be formed of the same material as the first barrier layer 140. Moreover, the second barrier layer 170 may consist of a plurality of films.

The thickness of the second barrier layer 170 is not particularly limited, but falls within a range from 0.1 nm to 10 nm, for example.

As described above, the second barrier layer 170 may not be disposed.
(Second Dielectric Layer 180)

The second dielectric layer 180 is formed of any dielectric substance. The second dielectric layer 180 may, for example, be formed of the same material as the first dielectric layer 130.

Alternatively, the second dielectric layer 180 may include a compound expressed by a general formula $Si_xAl_yN_zO_w$, considering a barrier property and abrasion resistance, where $0 \leq y/(x+y) \leq 0.5$, $0 \leq w < z$, $0.8 < z/(x+y) < 1.5$, and $0 \leq w/(x+y) \leq 0.2$.

The thickness of the second dielectric layer 180 is not particularly limited, but falls within a range from 20 nm to 60 nm, for example.

As described above, the second dielectric layer 180 may not be disposed.
(Application Example of the Laminated Body According to the Embodiment of the Present Invention)

The laminated body according to the embodiment of the present invention can be applied to components that require both an excellent heat shielding property and high transparency, such as window panes of buildings and doors of cooking ovens.

Figure 2:
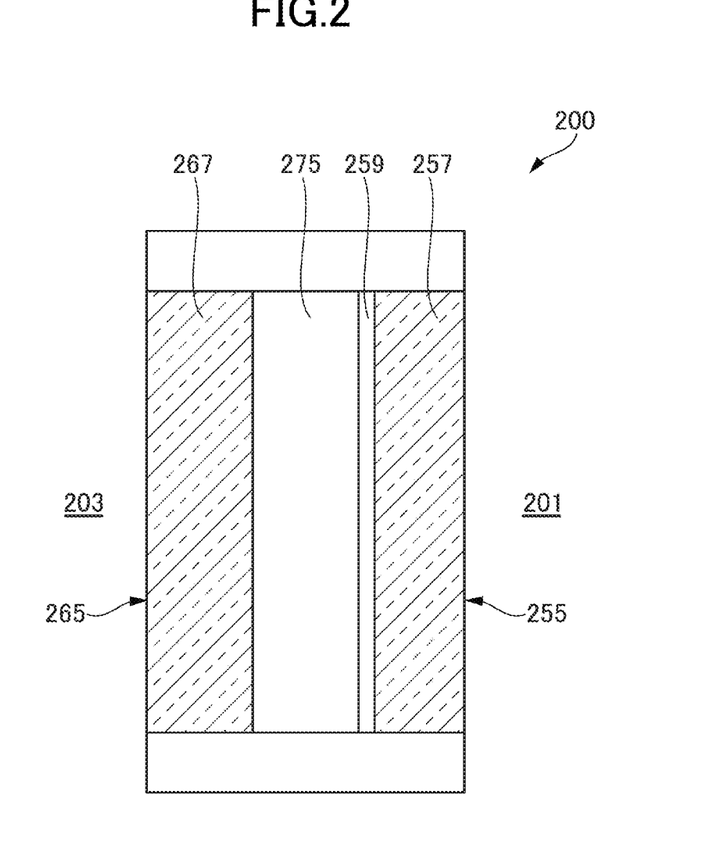
FIG. 2 is a cross-sectional view schematically illustrating a window pane of a building to which the laminated body according to the embodiment of the present invention is applied.

FIG. 2 is a diagram schematically illustrating a cross-section of a window pane of a building to which the laminated body according to the embodiment of the present invention is applied (hereinafter simply referred to as "window pane 200").

As shown in FIG. 2, the window pane 200 has a structure of double glazing, which is constituted by arranging a first glass member 255 and a second glass member 265 separated from each other. Between the glass members, an internal space 275 is formed. The internal space 275 may be a vacuum or filled with an inert gas.

The window pane 200 is mounted on a building sash or the like, for example, so that the first glass member 255 side is an indoor side 201 and the second glass member 265 side is an outdoor side 203.

The first glass member 255 has a first glass substrate 257. A laminated film 259 is arranged on one surface of the first glass substrate 257. The laminated film 259 is placed on the inner space 275 side.

On the other side, the second glass member 265 has a second glass substrate 267. In the second glass member 265, the second glass substrate 267 may be used alone or may have a laminated film on one surface.

The first glass member 255 consists of the laminated body according to the embodiment of the present invention. For example, the first glass member 255 may consist of the above-described first laminated body 100. In this case, the transparent substrate 110 is the first glass substrate 257.

In the above-described window pane 200, the ratio Tv/Rs of the first glass member 255 is large. Thus, the window pane 200 can be provided with both an excellent heat shielding property and high transparency.

In particular, when the second glass member 265 consists of the laminated body according to the embodiment of the present invention in addition to the first glass member 255, the window pane 200 may be provided with a more excellent thermal insulation property and higher transparency.

(Method for Manufacturing the Laminated Body According to the Embodiment of the Present Invention)

Next, a method of manufacturing the laminated body according to the embodiment of the present invention will be described with reference to FIG. 3.

Figure 3:
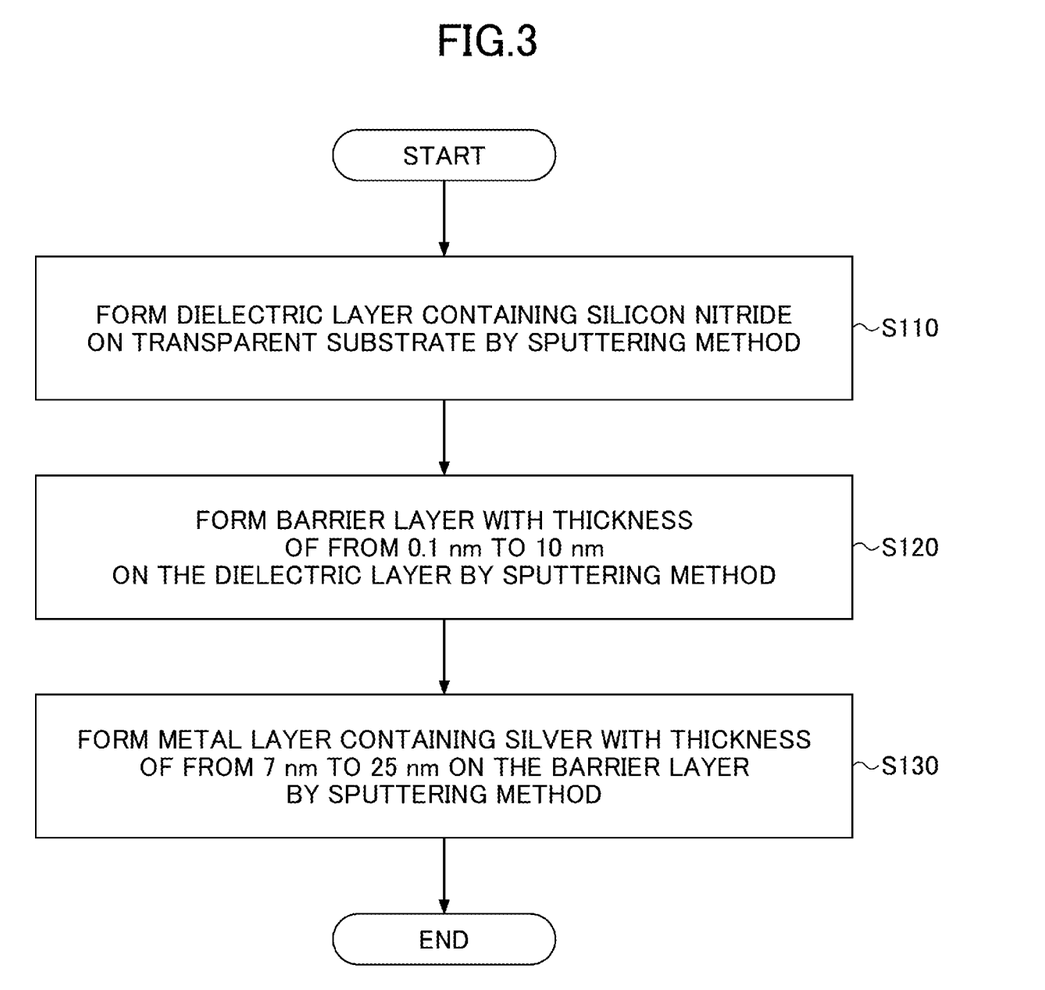
FIG. 3 is a flowchart illustrating a method of manufacturing the laminated body according to the embodiment of the present invention.

FIG. 3 is a flowchart schematically illustrating the method of manufacturing the laminated body according to the embodiment of the present invention (hereinafter referred to as the "first manufacturing method").

As shown in FIG. 3, the first manufacturing method includes:

a step of forming a dielectric layer containing silicon nitride on a transparent substrate by the sputtering method (step S110);

a step of forming a barrier layer having a thickness ranging from 0.1 nm to 10 nm on the dielectric layer by the sputtering method (step S120); and a step of forming a metal layer containing silver having a thickness ranging from 7 nm to 25 nm on the barrier layer by the sputtering method (step S130).

Each step will be described below. In the following, a method of manufacturing the first laminated body 100, as an example of the laminated body according to the embodiment of the present invention, will be described. Accordingly, the reference numerals shown in FIG. 1 will be used to indicate each member and layer.

(Step S110)

First, the transparent substrate 110 is prepared. A first dielectric layer 130 is also disposed on the first surface 112 of the transparent substrate 110. The transparent substrate 110 may be, for example, a glass substrate. The first dielectric layer 130 includes silicon nitride. The first dielectric layer 130 may be formed of SiAlN, for example.

The first dielectric layer 130 is formed by a sputtering method.

A discharge gas during the sputtering includes nitrogen. Concentration of nitrogen in the discharge gas ranges from 85 vol % to 100 vol %. The concentration of nitrogen in the discharge gas is preferably 90 vol % or more.

As a sputtering target, a planar target or a cylindrical target may be used.

Among the above-described targets, the planar target has a plate-like shape and is used in a stationary state. On the other hand, the cylindrical target has a cylindrical shape and is used in a rotating state around an axis.

A power density during the deposition falls within a range from 36 kW/m$^2$ to 70 kW/m$^2$ for the planar target. For the cylindrical target, the power density preferably falls within a range from 128 kW/m$^2$ to 363 kW/m$^2$.

Preferably, the power density is in the range from 45 kW/m$^2$ to 70 kW/m$^2$ for planar targets. The power density is preferably in the range from 200 kW/m$^2$ to 363 kW/m$^2$ for a cylindrical target.

The first dielectric layer 130 with a preferable surface state can be formed by selecting the discharge gas and the power density as described above for the deposition conditions for the first dielectric layer 130.

The deposition conditions during the sputtering of silicon nitride can be broadly classified into a metal mode, a transition mode, and a poisoned mode, depending on the composition of the discharge gas.

Among the above-described modes, the metal mode uses a discharge gas with a low nitrogen concentration. In the metal mode, the deposition rate of film can be significantly increased.

In the poisoned mode, a discharge gas with a high nitrogen concentration is used. In this case, the deposition speed is greatly reduced and an amount of non-nitrided silicon is reduced. In addition, it has been reported that excessive nitrogen is incorporated into a film, and a denseness of the film and the barrier property are lowered.

The transition mode has a property between the metal mode and the poisoned mode.

As described above, contrary to the general knowledge, in the present application, the first dielectric layer 130 is deposited in the poisoned mode. This is because in the silicon nitride film deposited in the metal mode, non-nitrided silicon is excessively left, and the optical properties of the film are similar to those of silicon. By depositing the first dielectric layer 130 in the poisoned mode, the above-described orientation index P can be increased to 4.5 or higher in the metal layer 150 obtained in the subsequent steps.

In general, the power density during the deposition is set to the minimum necessary in order to suppress arcing and to avoid enlargement of cooling equipment.

It is generally not known that the composition of the discharge gas and the power density, when the dielectric layer containing silicon nitride is formed, contribute to the crystal orientation of the metal layer.

(Step S120)

Next, a first barrier layer 140 is formed on the first dielectric layer 130. The first barrier layer 140 includes the material "A" as described above, and the material "A" has any one of the crystal structure of the above-described structures (i) to (iv).

The material "A" is preferably any of metal Ni, metal Cr, AlN, ZnO, and NiCr$_x$ (x ranges from 0.1 to 0.5). If the material "A" is a compound other than metal, an additional element may be doped.

The first barrier layer 140 is formed by the sputtering method.

The thickness of the first barrier layer 140 ranges from 0.1 nm to 10 nm.

When the thickness of the first barrier layer 140 including the material "A" is 10 nm or less, the surface state of the first dielectric layer 130 can affect the metal layer 150 formed in the subsequent step S130.

That is, the crystal orientation of the metal layer 150 deposited in step S130 can be controlled by the surface state of the first dielectric layer 130 previously formed, to cause the above-described orientation index P to fall within a range from 4.5 to 20. This also allows formation of the metal layer 150 having a small sheet resistance value.

The thickness of the first barrier layer 140 preferably ranges from 0.2 nm to 3.5 nm.

The first barrier layer 140 may consist of a plurality of films.

(Step S130)

Next, a metal layer 150 is formed on the first barrier layer 140. The metal layer 150 contains silver or contains a silver alloy.

The metal layer 150 is formed by the sputtering method.

The thickness of the metal layer 150 ranges from 7 nm to 25 nm. When the thickness of the metal layer 150 is 25 nm or less, the transparency of the metal layer 150 can be enhanced and the transparency of the entire laminated film 120 can be enhanced.

In step S120, as described above, a thin first barrier layer 140 including material "A" having a predetermined crystal structure is placed on the first dielectric layer 130. The above-described thin first barrier layer 140 is affected by the surface property of the underlying first dielectric layer 130, and the crystal orientation is improved.

Thus, the metal layer 150 disposed on the first barrier layer 140 can develop a crystal structure having a dominant orientation in a particular direction according to the crystal orientation of the first barrier layer 140. As a result, the metal layer 150 having a small number of defects can be formed.

Accordingly, the deposited metal layer 150 has the orientation index P ranging from 4.5 to 20. The orientation index P preferably falls within a range from 7 to 15.

Then, a second barrier layer 170, a second dielectric layer 180, or both may be formed on the metal layer 150 if necessary.

The second barrier layer 170, the second dielectric layer 180, or both may be formed by the sputtering method.

According to the above-described steps, the first laminated body 100 is manufactured.

According to the first manufacturing method, a laminated body with a high ratio Tv/Rs, i.e. having the excellent heat shielding property and high transparency, can be manufactured.

EXAMPLES

In the following, examples of the present invention will be described. In the following description, Examples 1 to 7 are practical examples, and Examples 22 to 25 are comparative examples.

Example 1

A laminated body was produced by forming a laminated film on one surface of the glass substrate by the following method.

Soda lime glass having a dimension of 100 mm long×50 mm wide×3.0 mm thick was used for the glass substrate.

The laminated film had a five layered structure consisting of a first dielectric layer, a first barrier layer, a metal layer containing silver, a second barrier layer, and a second dielectric layer in the order close to the glass substrate.

The first dielectric layer consisted of silicon nitride (target film thickness was 40 nm), the first barrier layer consisted of NiCr (target film thickness was 2 nm), the metal layer containing silver consisted of metallic silver (target film thickness was 16 nm), the second barrier layer consisted of NiCr (target film thickness was 1 nm), and the second dielectric layer consisted of silicon nitride containing aluminum (target film thickness was 51 nm).

The above-described layers were deposited by the sputtering method.

More specifically, the first dielectric layer was deposited using a planar target consisting of Si-10 wt % Al with pure nitrogen gas as the discharge gas. The pressure at the time of the deposition was 0.39 Pa and the input power density was 70 kW/m$^2$.

The first barrier layer was deposited using a planar target consisting of Ni-20 wt % Cr with argon gas as the discharge gas. The pressure during the deposition was 0.48 Pa.

The metal layer containing silver was deposited using a silver planar target with argon gas as the discharge gas. The pressure during the deposition was 0.46 Pa.

The second barrier layer was deposited using a planar target consisting of Ni-20 wt % Cr with argon gas as the discharge gas. The pressure during the deposition was 0.48 Pa.

The second dielectric layer was deposited using a planar target consisting of Si-10 wt % Al. A mixed gas of argon and nitrogen (a ratio of argon to nitrogen was 40 to 60 (sccm)) was used as the discharge gas. The pressure during the deposition was 0.42 Pa.

The deposition of each layer was carried out in the same sputtering chamber.

After the laminated film was formed on the glass substrate, the glass substrate was calcinated at 730° C. for 3 minutes in an air atmosphere.

According to the above-described processes, the laminated body (hereafter referred to as "Sample 1") was prepared.

Examples 2 to 6

Laminated bodies of Examples 2 to 6 were prepared in the same manner as in Example 1.

However, in Examples 2 to 6, the conditions for depositing the first dielectric layer were changed from the condition in Example 1. Specifically, an amount of nitrogen contained in the discharge gas, the input power density, or both was changed from that in Example 1. For the discharge gas, a mixed gas of nitrogen and argon was used, and the nitrogen content in the mixed gas was varied within the range from 85% to 100% by volume.

Other manufacturing conditions were the same as those in Example 1.

According to the above-described processes, laminated bodies (hereafter referred to as "Sample 2" to "Sample 6") were prepared.

Examples 22 to 24

Laminated bodies of Examples 22 to 24 were prepared in the same manner as in Example 1.

However, in Examples 22 to 24, the conditions for depositing the first dielectric layer were changed from the condition in Example 1. Specifically, an amount of nitrogen contained in the discharge gas, the input power density, or both was changed from that in Example 1. For the discharge gas, a mixed gas of nitrogen and argon was used, and the nitrogen content in the mixed gas was varied within the range from 30% to 78% by volume.

Other manufacturing conditions were the same as those in Example 1.

According to the above-described processes, laminated bodies (hereafter referred to as "Sample 22" to "Sample 24") were prepared.

In TABLE 1, shown below, the manufacturing conditions (nitrogen content in the discharge gas and power density) for the first dielectric layer in Samples 1 to 6 and Samples 22 to 24, and the material of the first barrier layer are summarized.

TABLE 1

| Sample | First dielectric layer | | First barrier layer |
|---|---|---|---|
| | Nitrogen (N$_2$) content (%) | Power density (kW/m$^2$) | |
| 1 | 100 | 70 | NiCr |
| 2 | 100 | 45 | NiCr |
| 3 | 100 | 36 | NiCr |
| 4 | 85 | 70 | NiCr |
| 5 | 85 | 45 | NiCr |
| 6 | 85 | 36 | NiCr |
| 22 | 78 | 45 | NiCr |
| 23 | 40 | 36 | NiCr |
| 24 | 30 | 70 | NiCr |

Example 7

A laminated body of Example 7 was prepared in the same manner as in Example 1.

However, in Example 7, the material of the first barrier layer was $ZnO:AlO_2$ (3 wt %). Thus, a planar target consisting of $ZnO$-3 wt % $AlO_2$ was used as the target. A pure nitrogen gas was used as the discharge gas, and the input power density was set to 50 $kW/m^2$. The pressure during the deposition was 0.46 Pa. The target film thickness of the first dielectric layer was 5 nm.

Other manufacturing conditions were the same as those in Example 1.

According to the above-described processes, a laminated body (hereafter referred to as "Sample 7") was prepared.

Example 25

A laminated body of Example 25 was prepared in the same manner as in Example 7.

However, in Example 25, a mixed gas of nitrogen and argon was used as the discharge gas when depositing the first dielectric layer. The nitrogen content in the mixed gas was 40% by volume.

Other manufacturing conditions were the same as those in Example 7.

According to the above-described processes, a laminated body (hereinafter referred to as "Sample 25") was prepared.

In TABLE 2, shown below, the manufacturing conditions (nitrogen content in the discharge gas and power density) for the first dielectric layer in Sample 7 and Sample 25, and the material of the first barrier layer are summarized.

TABLE 2

| Sample | First dielectric layer | | First barrier layer |
|---|---|---|---|
| | Nitrogen ($N_2$) content (%) | Power density ($kW/m^2$) | |
| 7 | 100 | 50 | $ZnO:AlO_2$ |
| 25 | 40 | 50 | $ZnO:AlO_2$ |

(Evaluation)
(Evaluation of Orientation Index P)

In each sample, the orientation index P which was defined as above was evaluated.

For the in-plane X-ray diffraction measurement for the metal layer, an in-plane XRD system (ATX-G; by Rigaku Corporation) was used. For the X-ray source, CuKα (wavelength 0.154 nm) was used.

Samples were irradiated with X-rays using a multi-layer film parallel beam method, which provides parallel beams with high efficiency, by using a multi-layer film mirror.

An incident angle of X-rays was set to be 0.5° so that X-rays were made incident onto the entire surface on which the laminated film of the sample was provided (hereinafter, referred to as an "irradiation surface"). Then, 2θχ/φ scan was performed along the irradiation surface of the sample while maintaining the incident angle constant. The divergent angle of the diffraction X-rays in the in-plane direction of the irradiation surface was limited to 0.5° by a slit.

From results of the in-plane X-ray diffraction measurement obtained for each sample, the orientation index P of the metal layer was calculated using the above-described formulas (1) to (5).

Figure 4:
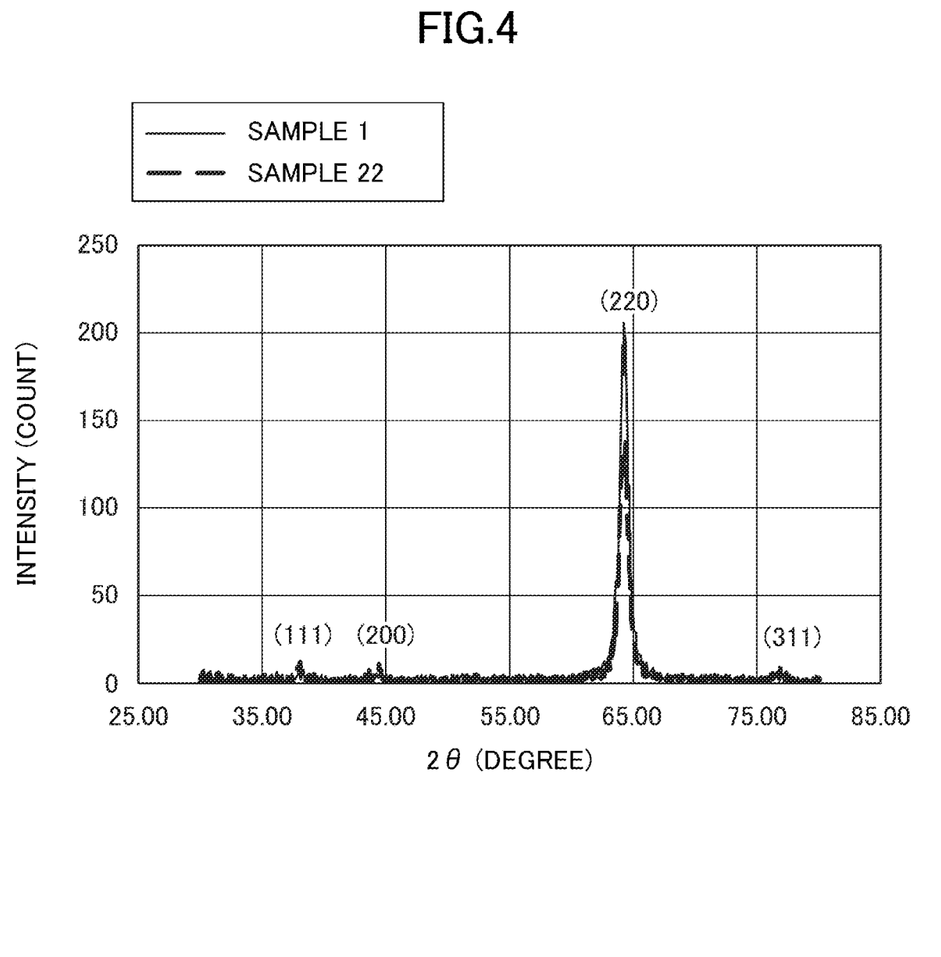
FIG. 4 is a diagram showing results of in-plane X-ray diffraction measurements for two samples of the laminated body.

FIG. 4 shows, as an example, the results of the in-plane X-ray diffraction measurements obtained for Sample 1 and Sample 22.

(Evaluation of Ratio Tv/Rs)

For each sample, the visible light transmittance Tv (%) and the sheet resistance value Rs (Ω/Sq) were measured.

For measuring the visible light transmittance, a visibility transmittance measurement device (TLV-304-LC by Asahi Spectra Co., Ltd.) was used. A transmittance of A light source light incident from the transparent substrate side, measured using a visibility correction filter, was defined to be a visible light transmittance of each sample Tv (%).

For measuring the sheet resistance value Rs, a sheet resistance meter (717B Conductance monitor by Delcom Instruments, Inc.) was used. A surface for the measurement was the surface of the laminated film.

The ratio Tv/Rs was calculated from the visible light transmittance Tv (%) and the sheet resistance value Rs (Ω/Sq), obtained as above.

In TABLES 3 and 4, shown below, results of evaluation obtained for samples are summarized.

TABLE 3

| Sample | Preferential orientation plane of metal layer containing silver | Orientation index P | Sheet resistance value Rs (Ω/sq) | Visible light transmittance Tv (%) | Ratio Tv/Rs |
|---|---|---|---|---|---|
| 1 | (111) | 10.25 | 3.05 | 54.6 | 17.90 |
| 2 | (111) | 11.33 | 3.07 | 54.1 | 17.62 |
| 3 | (111) | 7.48 | 3.15 | 54.3 | 17.24 |
| 4 | (111) | 10.48 | 3.11 | 54.3 | 17.46 |
| 5 | (111) | 5.79 | 3.24 | 53.4 | 16.48 |
| 6 | (111) | 4.62 | 3.27 | 54.2 | 16.57 |
| 22 | (111) | 2.99 | 3.32 | 53.3 | 16.05 |
| 23 | (220) | 1.82 | 3.45 | 53.8 | 15.59 |
| 24 | (220) | 1.18 | 3.56 | 44.2 | 12.42 |

TABLE 4

| Sample | Preferential orientation plane of metal layer containing silver | Orientation index P | Sheet resistance value Rs (Ω/sq) | Visible light transmittance Tv (%) | Ratio Tv/Rs |
|---|---|---|---|---|---|
| 7 | (111) | 12.43 | 2.52 | 67.1 | 26.63 |
| 25 | (220) | 1.22 | 2.98 | 66.0 | 22.15 |

From TABLES 3 and 4, it can be seen that in samples 22 to 25, the orientation indices P of the metal layer are found to be 2.99 or less at the maximum. On the other hand, in Samples 1 to 7, the orientation indices P of the metal layer are found to be greater than 4.5.

Thus, the sheet resistance values in Samples 1 to 7 are found to be lower than those in Samples 22 to 25.

TABLE 3 shows that the ratios Tv/Rs in Samples 22 to 24 are 16.05 or less at the maximum. On the other hand, the ratios Tv/Rs in Samples 1 to 6 are 16.48 or more, and Samples 1 to 6 are found to have a more excellent heat shielding property and higher transparency.

Furthermore, TABLE 4 shows that the ratio Tv/Rs in Sample 25 is 22.15, and the ratio Tv/Rs in Sample 7 is 26.63. Therefore, Sample 7 is found to have a more excellent heat shielding property and higher transparency.

Thus, Samples 1 to 7 provided with metal layers having orientation indices P greater than 4.5 have been found to have high transparency and an excellent heat shielding property.

As described above, preferred embodiments and the like have been described in detail. However, the present invention is not limited to the embodiments, or the like, but various variations, and replacements may be made without departing from the scope recited in claims.

What is claimed is:

1. A laminated body comprising:
a transparent substrate having a first surface; and
a laminated film provided on the first surface of the transparent substrate,
wherein the laminated film includes,
in the order close to the first surface,
a dielectric layer containing silicon nitride,
a first barrier layer on the dielectric layer, and
a metal layer containing silver arranged on the first barrier layer,
wherein the first barrier layer has a thickness of from 0.1 nm to 10 nm,
wherein the first barrier layer includes a material "A" which has a crystal structure of a face-centered cubic structure with a lattice constant of from 3.5 to 4.2 angstrom, a hexagonal close-packed structure with a lattice constant of from 2.6 to 3.3 angstrom, a body-centered cubic structure with a lattice constant of from 2.9 to 3.2 angstrom, or a tetragonal crystal with a lattice constant of from 2.9 to 4.4 angstrom,
wherein the metal layer containing silver has a thickness of from 7 nm to 25 nm, and
wherein an orientation index P of the metal layer containing silver, expressed by $$P = \frac{\text{Max}I[Is(111), Is(200), Is(220), Is(311)]}{\text{Max}II[Is(111), Is(200), Is(220), Is(311)]},$$

falls within a range from 4.5 to 20,
where Max [a, b, c,] represents the greatest value from among elements a, b and c,
Is(111), Is(200), Is(220), and Is(311) are obtained from peak intensities I(111), I(200), I(220), and I(311) in plane orientations of (111), (200), (220), and (311) obtained by in-plane X-ray diffraction measurements for the metal layer containing silver through Is(111)=I(111)/24, Is(200)=I(200)/46, Is(220)=I(220)/99, and Is(311)=I(311)/25, and
wherein the first barrier layer consists of at least one material selected from the group consisting of aluminum nitride (AlN), nickel (Ni), chromium (Cr), and a nickel-chromium alloy (NiCr$_x$), wherein x is ranging from 0.1 to 0.5, and wherein the laminated body has a Tv/Rs ratio of a visible light transmittance Tv (%) and a sheet resistance value Rs(Ω/Sq) of at least 16.48, and wherein the visible light transmittance Tv (%) is ≤66%.

2. The laminated body according to claim 1,
wherein the orientation index P falls within a range from 7 to 15.

3. The laminated body according to claim 1,
wherein the barrier layer has a thickness of from 0.1 nm to 3.5 nm.

4. The laminated body according to claim 1 further comprising:
a second dielectric layer above the metal layer containing silver,
wherein the second dielectric layer includes a compound expressed by a general formula Si$_x$Al$_y$N$_z$O$_w$, where 0≤y/(x+y)≤0.5, 0≤w<z, 0.8<z/(x+y)<1.5, and 0≤w/(x+y)≤0.2.

5. The laminated body according to claim 4 further comprising:
a second barrier layer between the metal layer containing silver and the second dielectric layer.

6. The laminated body according to claim 1, wherein the orientation index of the metal layer containing silver being $$P = \frac{Is(111)}{Is(200)}.$$

7. The laminated body according to claim 6,
wherein the orientation index P falls within a range from 7 to 15.

8. The laminated body according to claim 1, wherein the first barrier layer consists of NiCr$_x$, wherein x is ranging from 0.1 to 0.5.

9. The laminated body according to claim 5, wherein the laminated body consists of the transparent substrate, the first dielectric layer comprising silicon nitride, the first barrier layer, the metal layer, the second barrier layer and the second dielectric layer comprising silicon nitride, and the first dielectric layer consists of SiAlN and the second dielectric layer consists of Si$_x$Al$_y$N$_z$O$_w$, where 0≤y/(x+y)≤0.5, 0≤w<z, 0.8<z/(x+y)<1.5, and 0≤w/(x+y)≤0.2.

10. The laminated body of claim 1,
wherein the visible light transmittance Tv (%) is ≤65%.

11. The laminated body of claim 1,
wherein the visible light transmittance Tv (%) is 50%-66%.

12. The laminated body of claim 1,
wherein the visible light transmittance Tv (%) is 50%-65%.

13. A double glazing comprising:
a first glass member; and
a second glass member arranged so as to be parallel to the first glass member,
wherein at least one of the first glass member and the second glass member is composed of the laminated body according to claim 1.

14. A method of manufacturing a laminated body of claim 1, the method comprising:
forming a dielectric layer containing silicon nitride on a transparent substrate having a first surface, by a sputtering method at a predetermined electric power density in a discharge gas containing nitrogen,
a content of nitrogen in the discharge gas ranging from 85% to 100% by volume, and
the predetermined electric power density ranging from 36 kW/m² to 70 kW/m² for a planar target and ranging from 128 kW/m² to 363 kW/m² for a cylindrical target;
forming a barrier layer composed of a single film or two or more films on the dielectric layer by the sputtering method,
the barrier layer having a thickness of from 0.1 nm to 10 nm, each film of the barrier layer including a material "A" which has a crystal structure of a face-centered cubic structure with a lattice constant of from 3.5 to 4.2 angstrom, a hexagonal close-packed structure with a lattice constant of from 2.6 to 3.3 angstrom, a body-centered cubic structure with a lattice constant of from 2.9 to 3.2 angstrom, or a tetragonal crystal with a lattice constant of from 2.9 to 4.4 angstrom; and forming a metal layer containing silver having a thickness of from 7 nm to 25 nm on the barrier layer by the sputtering method.

\* \* \* \* \*

UNITED STATES PATENT AND TRADEMARK OFFICE
CERTIFICATE OF CORRECTION

| | |
|---|---|
| PATENT NO. | : 12,246,986 B2 |
| APPLICATION NO. | : 17/580205 |
| DATED | : March 11, 2025 |
| INVENTOR(S) | : Shunya Taki et al. |

Page 1 of 1

It is certified that error appears in the above-identified patent and that said Letters Patent is hereby corrected as shown below:

In the Claims

In Claim 1, Column 15, Line 39, please delete "$P = \dfrac{Max\ I[Is(111),Is(200),Is(220),Is(311)]}{Max\ II\ [Is(111),Is(200),Is(220),Is(311)]}$" and replace with --$P = \dfrac{Is(111)}{Max\ [Is(200),Is(220),Is(311)]}$--.

Signed and Sealed this
Twenty-sixth Day of August, 2025

Coke Morgan Stewart
*Acting Director of the United States Patent and Trademark Office*